(12) United States Patent
Dinc et al.

(10) Patent No.: US 12,651,689 B2
(45) Date of Patent: Jun. 9, 2026

(54) MULTI-TURN DISTRIBUTED ACTIVE TRANSFORMER POWER COMBINER

(71) Applicant: TEXAS INSTRUMENTS INCORPORATED, Dallas, TX (US)

(72) Inventors: Tolga Dinc, Dallas, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 957 days.

(21) Appl. No.: 17/708,246

(22) Filed: Mar. 30, 2022

(65) Prior Publication Data

US 2023/0317348 A1     Oct. 5, 2023

(51) Int. Cl.
| | |
|---|---|
| *H01F 5/00* | (2006.01) |
| *H01F 27/28* | (2006.01) |
| *H10D 1/20* | (2025.01) |

(52) U.S. Cl.
CPC ........... *H01F 27/2804* (2013.01); *H10D 1/20* (2025.01); *H01F 2027/2809* (2013.01)

(58) Field of Classification Search
CPC ................................................. H01F 27/2804
USPC ................................................. 336/200, 225
See application file for complete search history.

(56) References Cited

U.S. PATENT DOCUMENTS

| | | | | |
|---|---|---|---|---|
| 7,940,152 B1* | 5/2011 | Kim | ........................ | H01F 19/04 |
| | | | | 336/182 |
| 8,049,589 B2* | 11/2011 | Chen | ...................... | H03H 7/422 |
| | | | | 336/200 |
| 2012/0242406 A1* | 9/2012 | Ke | ...................... | H01F 27/2804 |
| | | | | 330/195 |
| 2014/0225698 A1* | 8/2014 | Swirhun | ................. | H01F 27/29 |
| | | | | 29/602.1 |

OTHER PUBLICATIONS

R. A. Shaheen, T. Rahkonen, R. Akbar, A. Sethi and A. Parssinen, "A Fully Differential Single-Stage Four-way mmWave Power Combiner for Phased Array 5G Systems," ISWCS 2019, Oulu, Finland, 2019.

* cited by examiner

*Primary Examiner* — Ronald Hinson
(74) *Attorney, Agent, or Firm* — Zhenhai Fu; Frank D. Cimino

(57) ABSTRACT

An apparatus includes a first primary coil, a second primary coil, and a secondary coil. The first and second primary coils each include a first, second, and third portion. The secondary coil includes a first and second portion in a first wafer layer, which are coupled together by a bridge in a second wafer layer. The second portion of the first primary coil is nested inside the first portion of the secondary coil in the first wafer layer. The second portion of the second primary coil is nested inside the second portion of the secondary coil in the first wafer layer. At least parts of the first and third portions of the first primary coil are adjacent the second portion of the secondary coil, and at least parts of the first and third portions of the second primary coil are adjacent the first portion of the secondary coil.

19 Claims, 19 Drawing Sheets

MULTI-TURN DISTRIBUTED ACTIVE TRANSFORMER POWER COMBINER

BACKGROUND

Distributed active transformers are used in power combining to efficiently increase signal power in radio frequency systems. For some target output signal powers, power amplifiers may require output networks with high transformer ratios such as a one to three transformation. However, the quality factor and coupling coefficients of output transformer combiners degrade with the increased turn ratio and reduced coil size needed to provide such high transformer ratios, decreasing the efficiency.

SUMMARY

An apparatus includes a first primary coil, a second primary coil, and a secondary coil. The first and second primary coils each include a first, second, and third portion. The secondary coil includes a first and second portion in a first wafer layer, which are coupled together by a bridge in a second wafer layer. The second portion of the first primary coil is nested inside the first portion of the secondary coil in the first wafer layer. The second portion of the second primary coil is nested inside the second portion of the secondary coil in the first wafer layer. At least parts of the first and third portions of the first primary coil are adjacent the second portion of the secondary coil, and at least parts of the first and third portions of the second primary coil are adjacent the first portion of the secondary coil.

In some implementations, the first and third portions of the first primary coil are in the first wafer layer, and the parts of the first and third portions of the first primary coil are nested outside the second portion of the secondary coil. The first and third portions of the second primary coil are in the first wafer layer, and the parts of the first and third portions of the second primary coil are nested outside the first portion of the secondary coil. The first and second portions of the second primary coil are coupled together in the first wafer layer by a first joiner, and the second and third portions of the second primary coil are coupled together in the first wafer layer by a second joiner, in some implementations.

The first and second portions of the first primary coil are coupled together by a third joiner in the second wafer layer, and the second and third portions of the first primary coil are coupled together by a fourth joiner in the second wafer layer, in some implementations. In other implementations, the first and second portions of the first primary coil are coupled together by a third joiner in a third wafer layer and the second and third portions of the first primary coil are coupled together by a fourth joiner in the third wafer layer. The second wafer layer is above the first wafer layer, and the third wafer layer is below the first wafer layer, in some implementations.

The apparatus can further comprise a first lead coupled to the first portion of the secondary coil and a second lead coupled to the second portion of the secondary coil. The first and second leads provide a differential output signal. In some implementations, the first and second leads are in the second wafer layer. In some implementations, the first and third portions of the first primary coil receive a first differential input signal, and the first and third portions of the second primary coil receive a second differential input signal.

BRIEF DESCRIPTION OF THE DRAWINGS

For a detailed description of various examples, reference will now be made to the accompanying drawings in which.

DETAILED DESCRIPTION

Figure 1A:
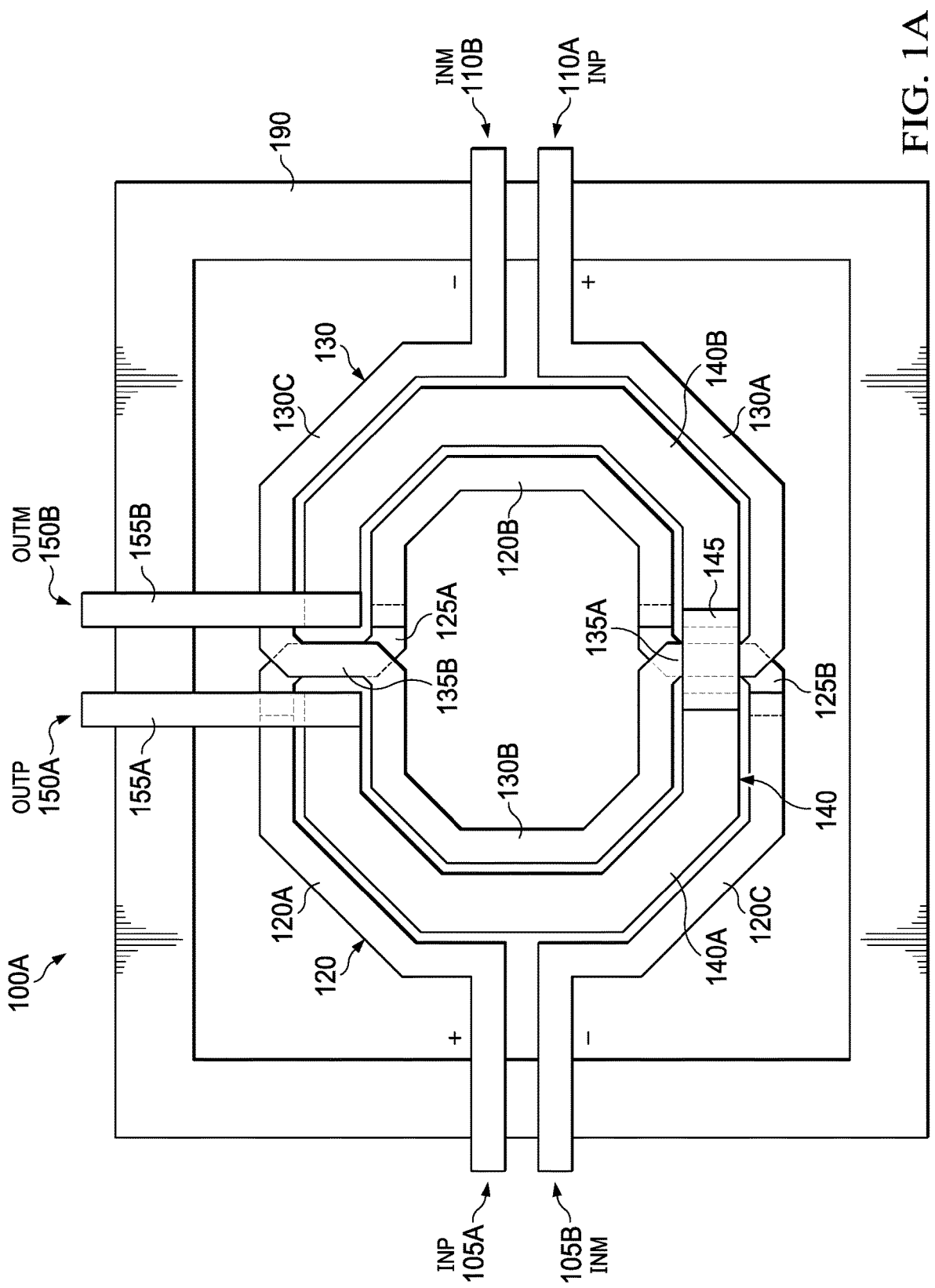
FIGS. 1A-D illustrate different perspectives of a multi-turn distributed active transformer power combiner.

The same reference number is used in the drawings for the same or similar (either by function and/or structure) features.

The described multi-turn distributed active transformer (DAT) power combiners include first and second primary coils having three portions each and a secondary coil with two portions. The first and second portions of the secondary coil are in a first wafer layer and coupled together by a bridge in a second wafer layer adjacent the first wafer layer. The second portions of the first and second primary coils are nested inside the first and second portions of the secondary coil in the first wafer layer. At least parts of the first and third portions of the first primary coil are adjacent the second portion of the secondary coil, and at least parts of the first and third portions of the second primary coil are adjacent the first portion of the secondary coil.

FIGS. 1A-D illustrate different perspectives of a multi-turn DAT power combiner 100. FIG. 1A illustrates an overhead view 100A of the power combiner 100, which includes a first primary coil 120, a second primary coil 130, and a secondary coil 140 in a single layer. The primary coils 120 and 130 sandwich the secondary coil 140, such that primary coils 120 and 130 and the secondary coil 140 are sidewall coupled together. A ground ring 190 isolates the DAT power combiner 100 from other circuits on the semiconductor wafer. The secondary coil 140 is described further with respect to FIG. 1B and includes a first portion 140A and a second portion 140B having a same width. The first primary coil 120 is described further with respect to FIG. 1C and includes three portions having a same width: a first portion 120A, a second portion 120B, and a third portion 120C. Similarly, the second primary coil 130 is described further with respect to FIG. 1D and includes three portions having a same width: a first portion 130A, a second portion 130B, and a third portion 130C.

Figure 1B:
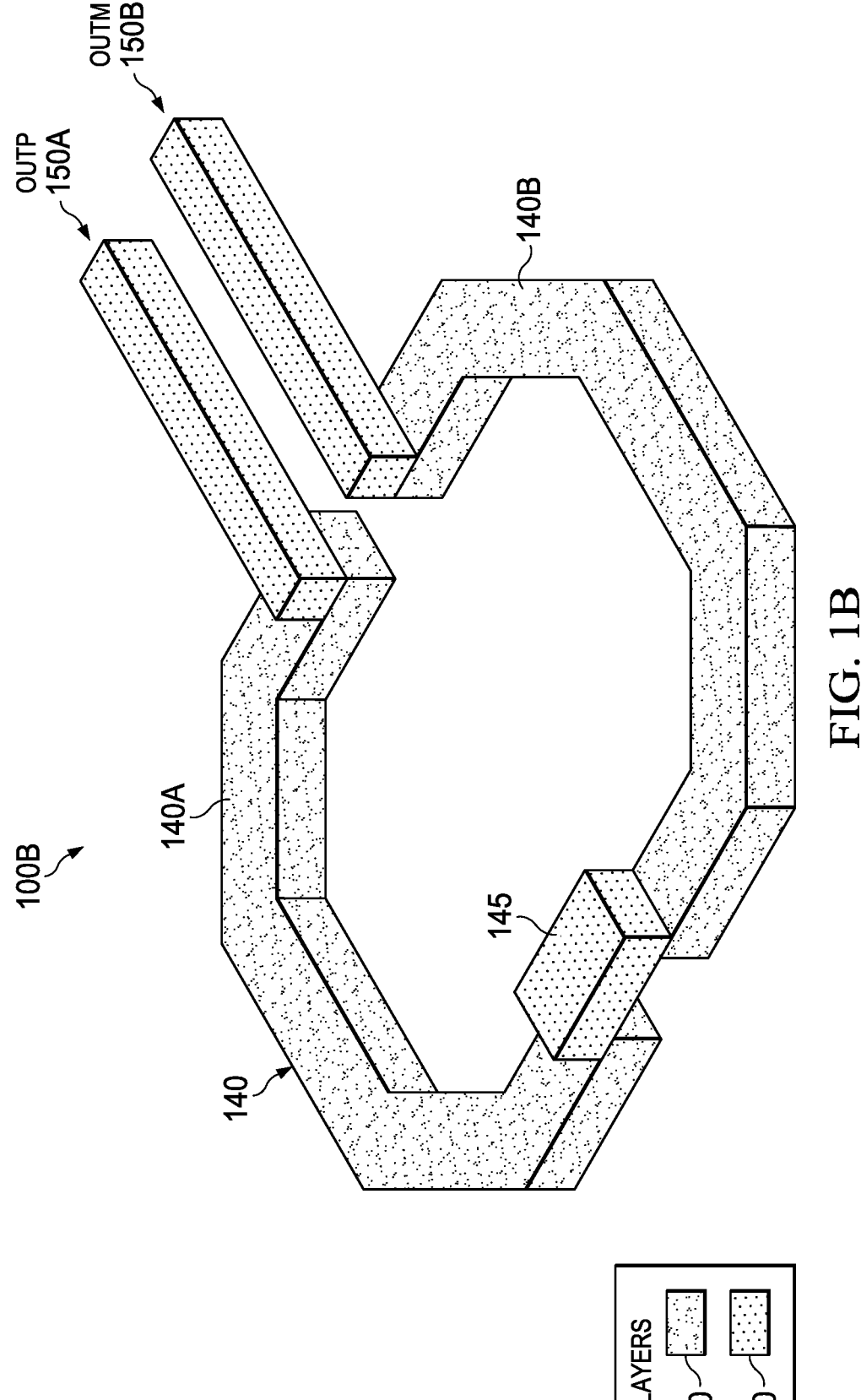

FIG. 1B shows a perspective view 100B of the secondary coil 140. The first and second portions 140A-B of the secondary coil 140 form half circles in a first layer 160 of the DAT power combiner 100 and are connected together by bridge 145 in a different layer 170 of the DAT power combiner 100. A first via connects the first portion 140A in layer 160 to the bridge 145 in layer 170, and a second via connects the second portion 140B in layer 160 to the bridge 145 in layer 170. A first lead 155A in the layer 170 is coupled to the first portion 140A in layer 160 by a via and provides the positive output signal OUTP 150A of the differential output signal OUT 150. A second lead 155B in the layer 170 is coupled to the second portion 140B in layer 160 by a via and provides the negative output signal OUTM 150B of OUT 150. In this example, the layer 170 including the bridge 145 and leads 155A-B is above the layer 160 including the secondary coil 140, but in other implementations, the layer 170 is below the layer 160.

Figure 1C:
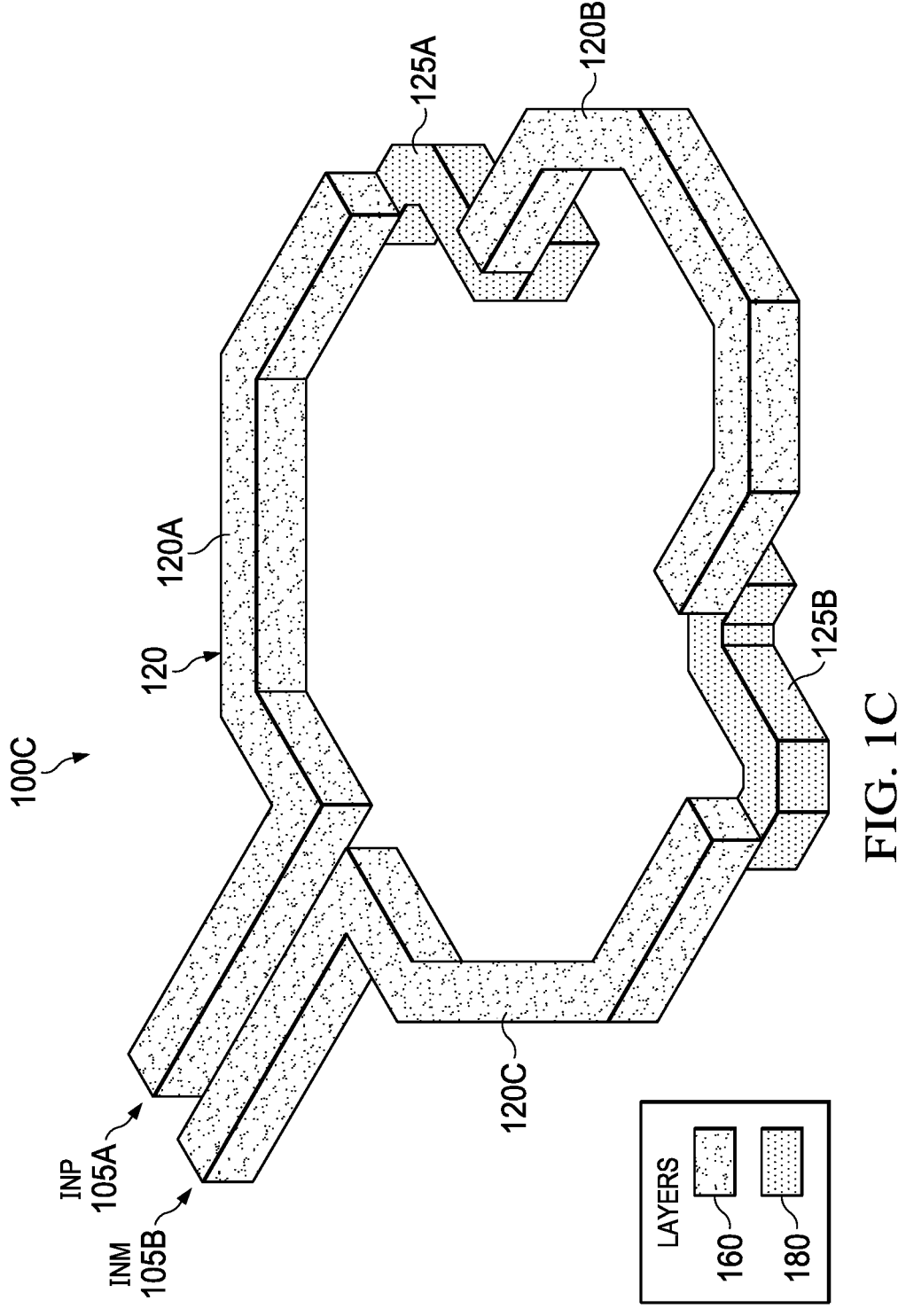

FIG. 1C shows a perspective view 100C of the first primary coil 120. The first portion 120A of the first primary coil 120 receives a positive input INP 105A of a first differential input signal IN 105 and forms a quarter circle around the outside of the first portion 140A of the secondary coil 140 in layer 160. The first portion 120A and the second portion 120B of the first primary coil 120 in layer 160 are coupled together by a first S-shaped joiner 125A in a different layer 180 of the DAT power combiner 100. The layer 180 is different from the layer 170 shown in FIG. 1B. A first via connects the first portion 120A in layer 160 to the first joiner 125A in layer 180, and a second via connects the second portion 120B in layer 160 to the first joiner 125 in layer 180. The second portion 120B forms a half circle along the inside of the second portion 140B of the secondary coil 140 in layer 160.

The second portion 120B and the third portion 120C of the first primary coil 120 in layer 160 are coupled together by a second S-shaped joiner 125B in the layer 180. A first via connects the second portion 120B in layer 160 to the second joiner 125B in layer 180, and a second via connects the third portion 120C in layer 160 to the second joiner 125B in layer 180. The third portion 120C of the first primary coil 120 forms a quarter circle around the outside of the first portion 140A of the secondary coil 140 in layer 160 and receives a negative input INM 105B of IN 105. In this example, the layer 180 including the first and second joiners 125A-B is placed below the layer 160 including the first primary coil 120, but in other implementations, the layer 180 is placed in a layer above the layer 160 such as in implementations in which the layer 170 including the bridge 145 and leads 155A-B is placed below the layer 160.

Figure 1D:
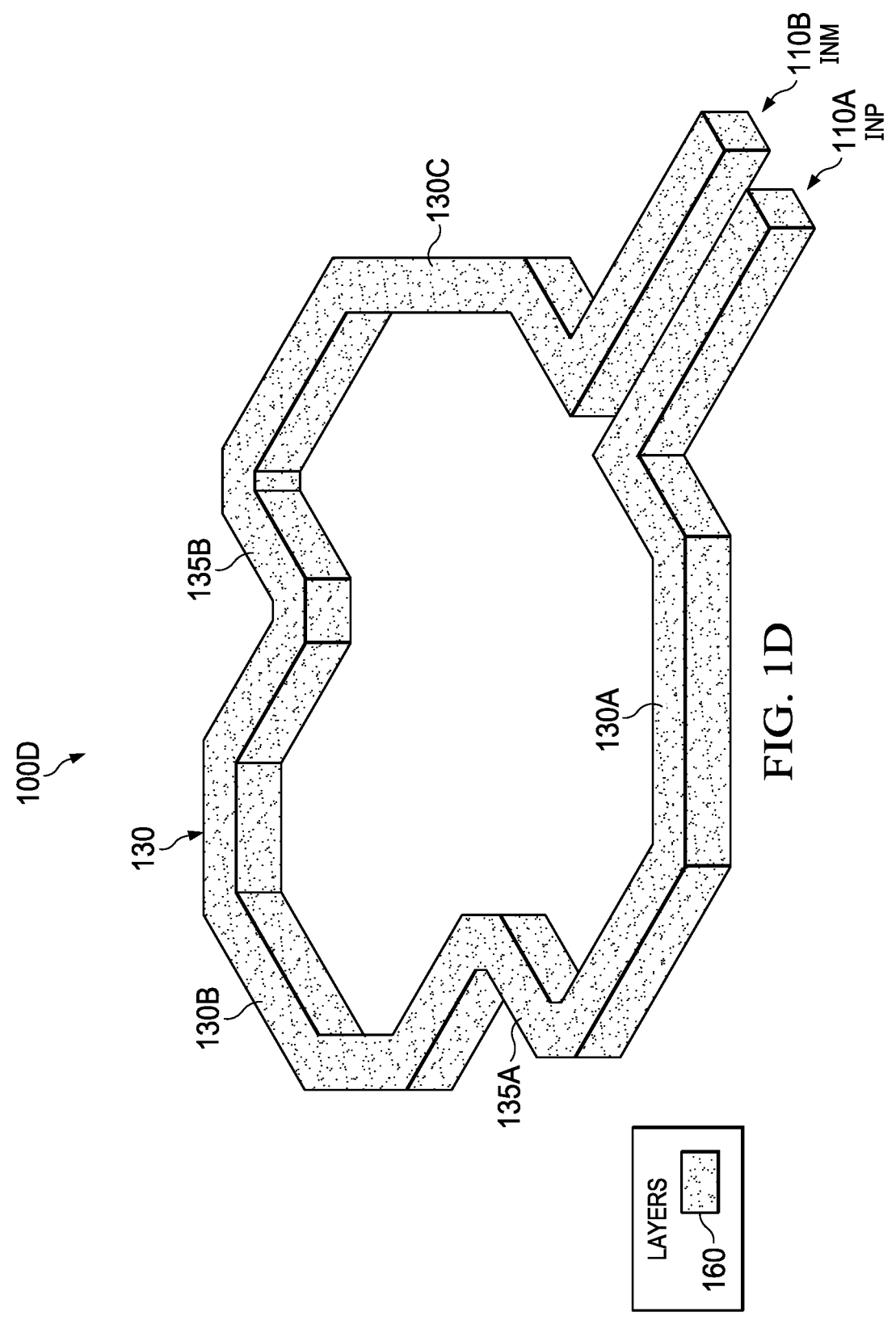

FIG. 1D shows a perspective view of the second primary coil 130. The first portion 130A of the second primary coil 130 receives a positive input INP 110A of a second differential input signal IN 110 and forms a quarter circle around the outside of the second portion 140B of the secondary coil 140 in layer 160. The first portion 130A and the second portion 130B of the second primary coil 130 are coupled together by a first S-shaped joiner 135A in the same layer 160. The second portion 130B forms a half circle along the inside of the first portion 140A of the secondary coil 140. The second portion 130B and the third portion 130C of the second primary coil 130 are coupled together by a second S-shaped joiner 135B in the same layer 160.

The third portion 130C of the second primary coil 130 forms a quarter circle around the outside of the second portion 140B of the secondary coil 140 in layer 160 and receives a negative input INM 110B of IN 110. In this example, the first and second joiners 125A-B are placed in a different layer 180, and the first and second joiners 135A-B are placed in the same layer 160. In other implementations, the first and second joiners 125A-B are placed in the same layer 160, and the first and second joiners 135A-B are placed in the different layer 180. In some implementations, the layer 170 and the layer 180 are the same layer, such that the bridge 145, the leads 155A-B, and the joiners 125A-B and 135A-B are in a same layer.

Figure 2:
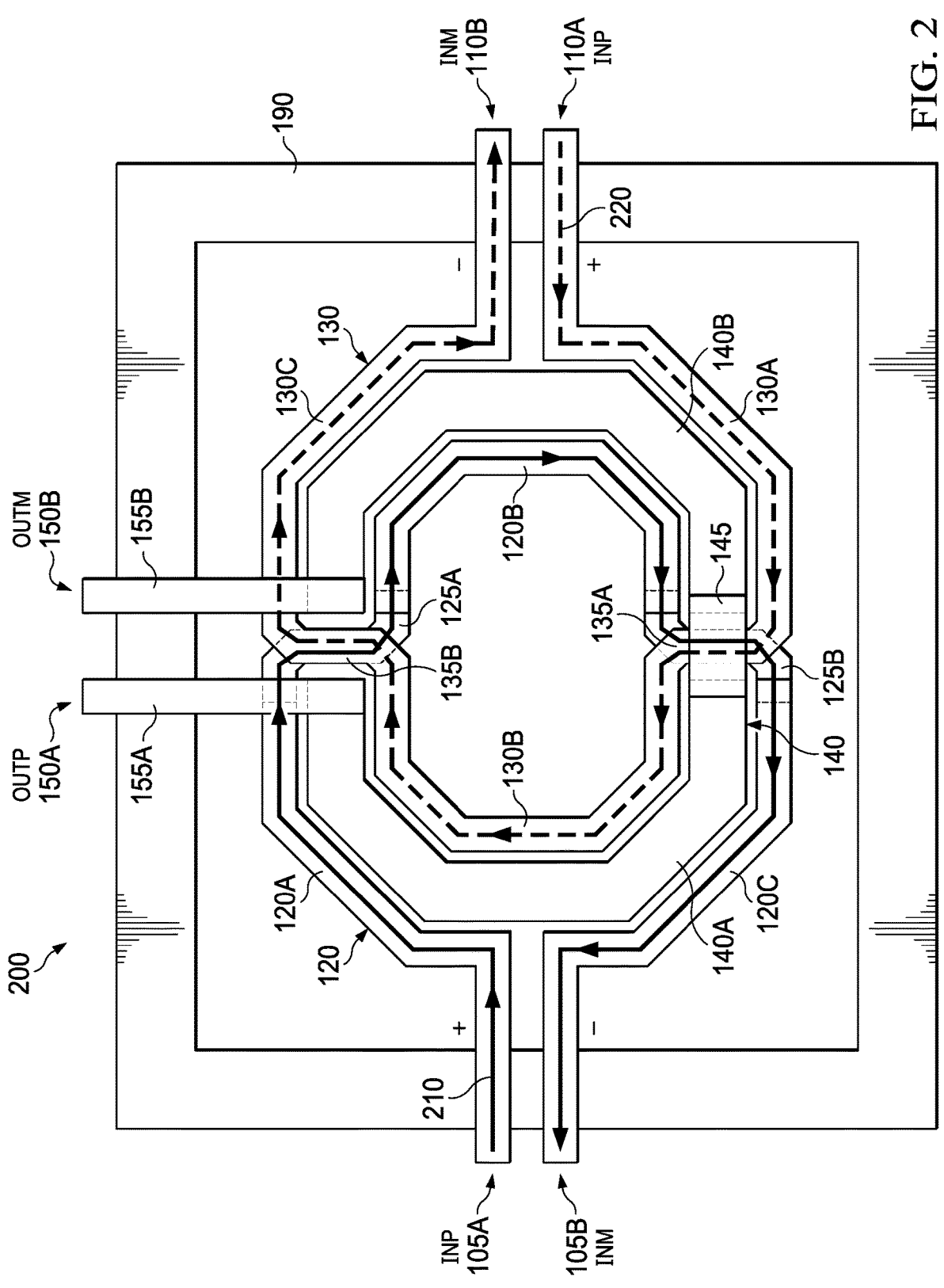
FIG. 2 shows a diagram of current flow through the multi-turn distributed active transformer power combiner shown in FIG. 1A.

FIG. 2 shows a diagram 200 of current flow through the multi-turn DAT power combiner 100 shown in FIG. 1A. The input signal IN 105 follows path 210 through the first primary coil 120, and the input signal IN 110 follows path 220 through the second primary coil 130. In path 210, the current directions between the outer, first portion 120A of the first primary coil 120 to the inner, second portion 120B of the first primary coil 120 are the same, and the current directions between the inner, second portion 120B to the outer, third portion 120C of the first primary coil 120 are the same. The same current direction throughout path 210 increases the mutual inductance of the first primary coil 120.

Similarly in path 220, the current directions between the outer, first portion 130A of the second primary coil 130 to the inner, second portion 130B of the second primary coil 130 are the same, and the current directions between the inner, second portion 130B to the outer, third portion 130C of the second primary coil 130 are the same. The same current direction throughout path 220 increases the mutual inductance of the second primary coil 130. In addition, the same widths of the portions 120A-C of the first primary coil 120 cause the input signal IN 105 to have a same signal strength and phase throughout the portions 120A-C. The same widths of the portions 130A-C of the second primary coil 130 cause the input signal IN 110 to have a same signal strength and phase throughout the portions 130A-C.

Figure 3A:
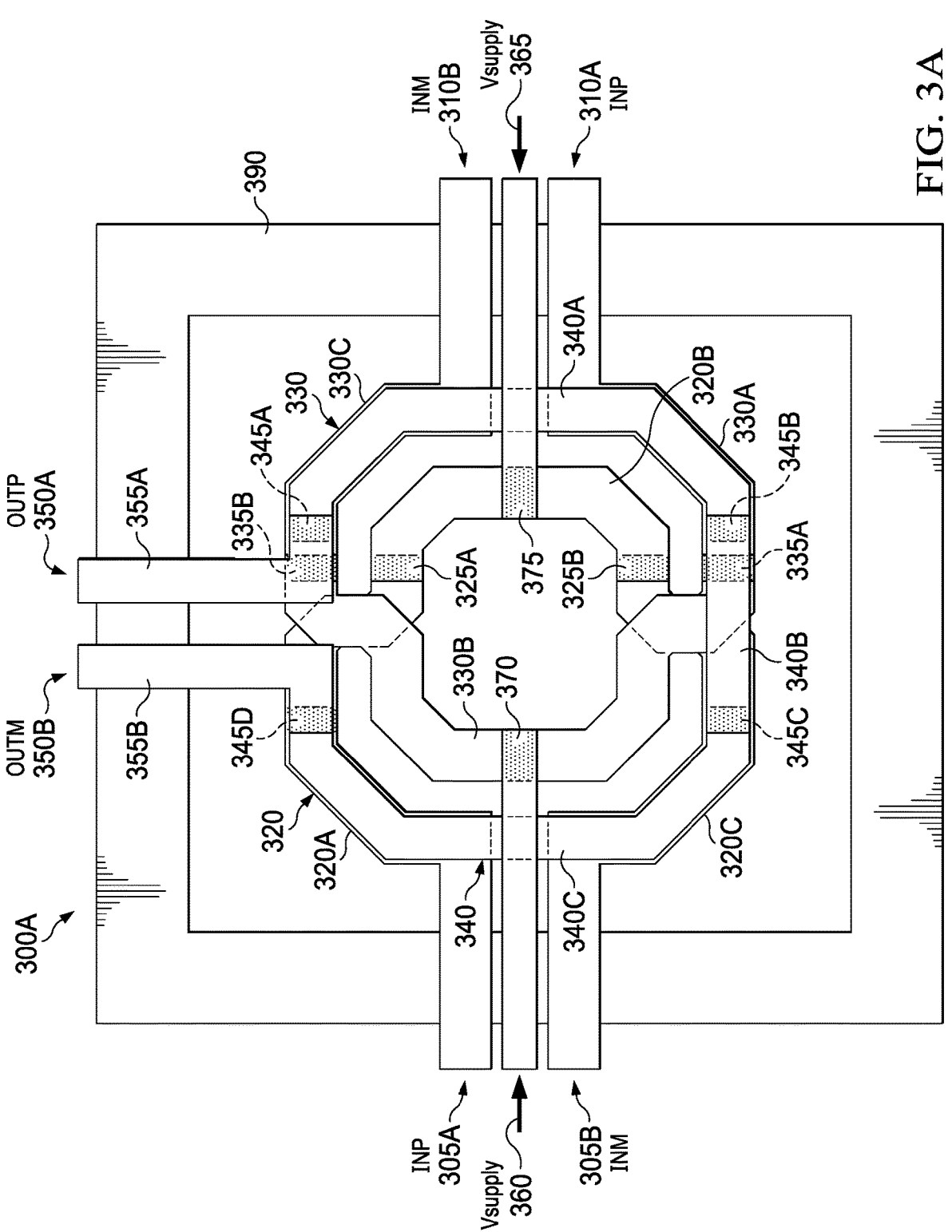
FIGS. 3A-E illustrate different perspectives of another multi-turn distributed active transformer power combiner.

FIG. 3A-E illustrate different perspectives of another multi-turn DAT power combiner 300. FIG. 3A illustrates an overhead view 300A of the power combiner 300, which includes a first primary coil 320, a second primary coil 330, and a secondary coil 340. The primary coils 320 and 330 are placed underneath and inside the secondary coil 340, such that primary coils 320 and 330 and the secondary coil 340 are coupled together both by sidewall coupling and broadside coupling. A ground ring 390 isolates the DAT power combiner 300 from other circuits on the semiconductor wafer. The secondary coil 340 is described further with respect to FIG. 3B and includes three portions having a same width: a first portion 340A in a first layer, a second portion 340B in a second layer, and a third portion 340C in the first layer.

Figure 3B:
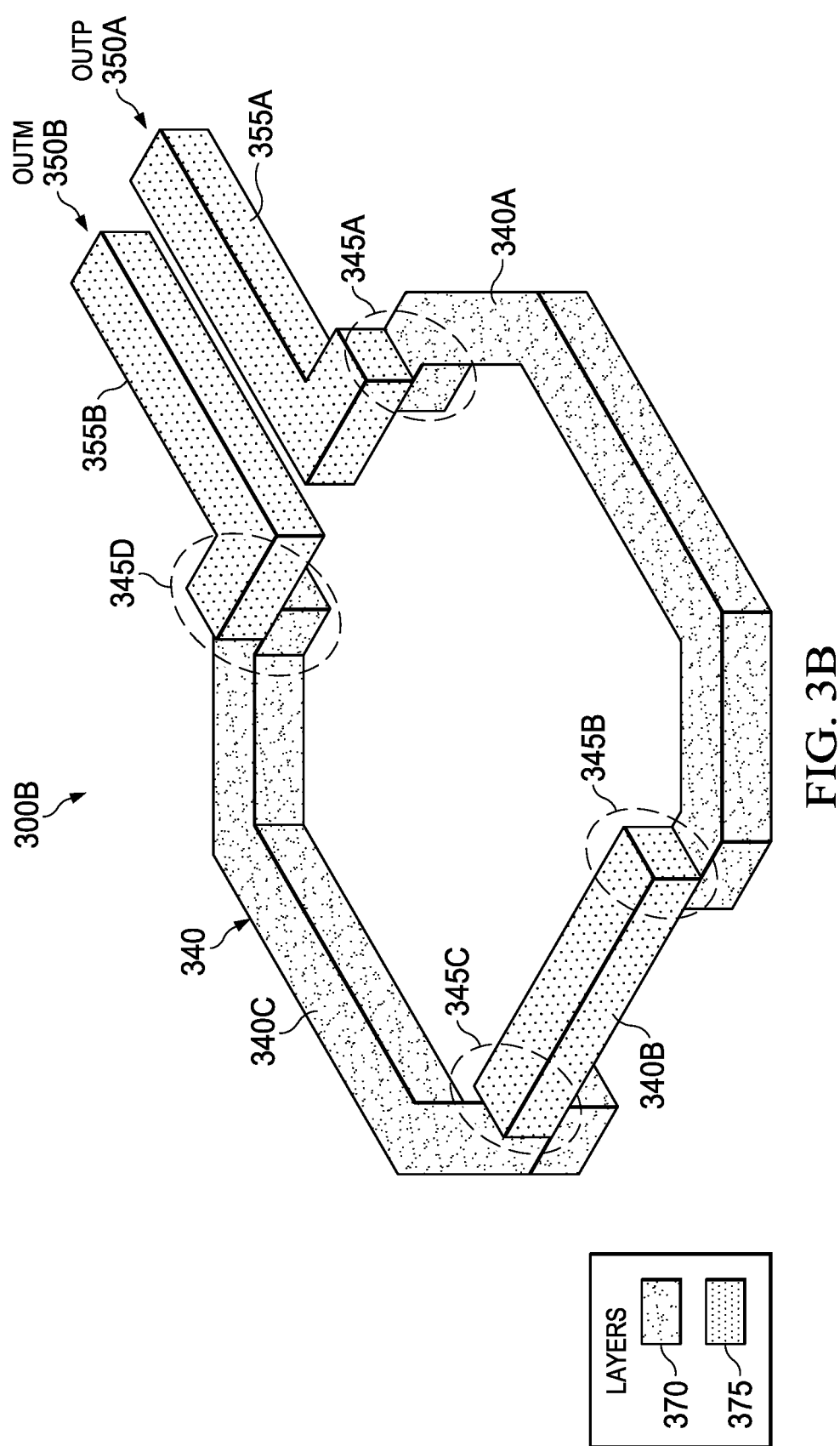
Figure 3C:
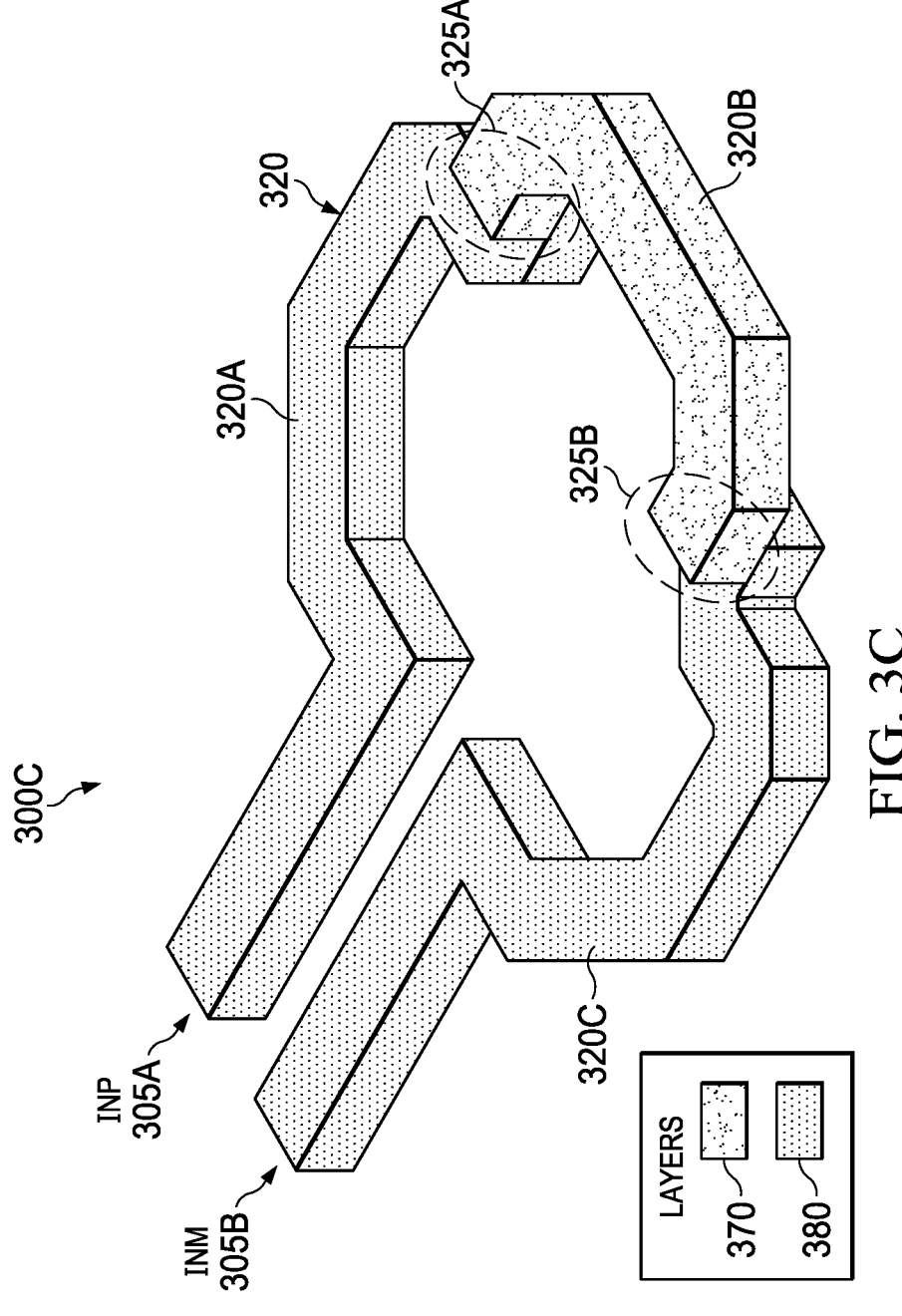

The first primary coil 320 is described further with respect to FIG. 3C and includes two portions having a same width: a first portion 320A in a third layer and a second portion 320B in the first layer. Similarly, the second primary coil 330 is described further with respect to FIG. 3D and includes two portions having a same width: a first portion 330A in the third layer and a second portion 330B in the first layer. The second portion 330B of the second primary coil 330 is coupled to a first supply voltage Vsupply 360, and the second portion 320B of the first primary coil 320 is coupled to receive a second supply voltage Vsupply 365. In some implementations, the supply voltages Vsupply 360 and 365 are the same.

FIG. 3B shows a perspective view 300B of the secondary coil 340. The first portion 340A of the secondary coil 340 in layer 370 is coupled to a lead 355A in layer 375 by a via 345A. The lead 355A provides the positive output signal OUTP 350A of the differential output signal 350. The first portion 340A in layer 370 is coupled to the second portion 340B of the secondary coil 340 in layer 375 by a via 345B. The second portion 340B is coupled to the third portion 340C in layer 370 by a via 345C. The third portion 340C is coupled to a lead 355B in layer 375 by a via 345D. The lead 355B provides the negative output signal OUTM 350B of OUT 350. In this example, the layer 375 including the second portion 340B and leads 355A-B is placed above the layer 370 including the first portion 340A and the third portion 340C, but in other implementations, the layer 375 is placed below the layer 370.

FIG. 3C shows a perspective view 300C of the first primary coil 320. The first portion 320A of the first primary coil 320 receives a positive input INP 305A of a first differential input signal IN 305 and is positioned in layer 380 below the third portion 340C of the secondary coil 340 in the layer 370. The shape of the first portion 320A of the first primary coil 320 is arranged such that the via 325A couples the first portion 320A to the second portion 320B of the first primary coil 320 in layer 370.

The second portion 320B of the first primary coil 320 nests on the inside the first portion 340A of the secondary coil 340 in layer 370. The shape of the third portion 320C of the first primary coil 320 in layer 380 is arranged such that the via 325B couples the second portion 320B in layer 370 to the third portion 320C in layer 380. The third portion 320C receives a negative input INM 305B of the first input signal IN 305. The layer 380 is placed below the layer 370 in this example, but in other implementations, the layer 380 is placed above the layer 370.

Figure 3D:
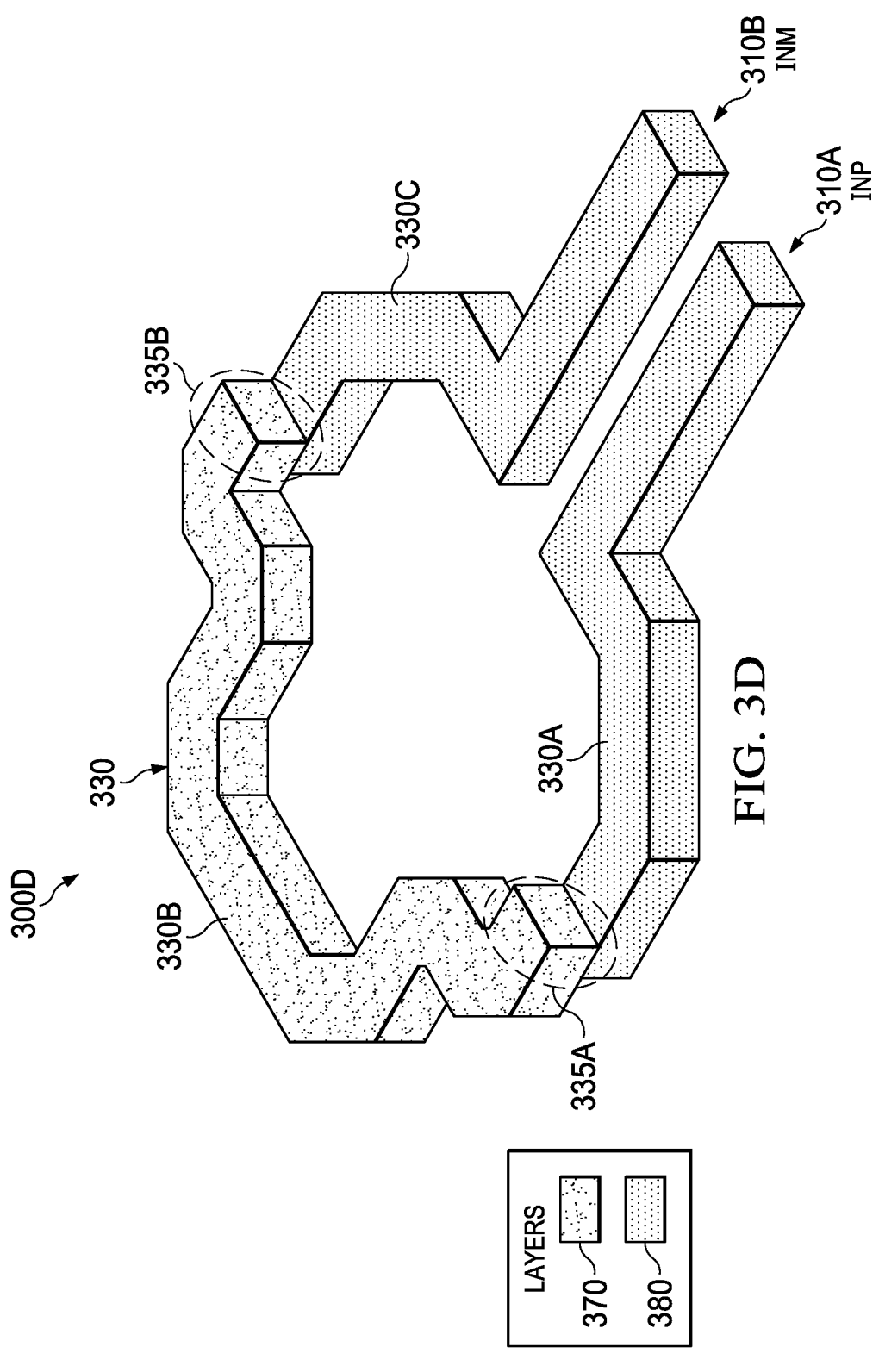

FIG. 3D shows a perspective view 300D of the second primary coil 330. The first portion 330A of the second primary coil 330 receives a positive input INP 310A of a second differential input signal IN 310 and is positioned in layer 380 below the first portion 340A of the secondary coil 340 in the layer 370. The shape of the first portion 330A of the second primary coil 320 is arranged such that the via 335A couples the first portion 330A to the second portion 330B of the second primary coil 330 in layer 370.

The second portion 330B of the second primary coil 330 nests on the inside the second portion 340B of the secondary coil 340 in layer 370. The shape of the third portion 330C of the second primary coil 330 in layer 380 is arranged such that the via 335B couples the second portion 330B in layer 370 to the third portion 330C in layer 380. The third portion 330C receives a negative input INM 310B of the second input signal IN 310. The layer 380 is placed below the layer 370 in this example, but in other implementations, the layer 380 is placed above the layer 370.

In this example, the first portion 320A and the third portion 320C of the first primary coil 320 and the first portion 330A and the third portion 330C of the second primary coil 330 are placed in a layer 380 that is different from the layer 375 including the second portion 340B of the secondary coil 340. In other implementations, the first portion 320A and the third portion 320C of the first primary coil 320 and the first portion 330A and the third portion 330C of the second primary coil 330 are placed in the same layer 375 including the second portion 340B of the secondary coil 340.

Figure 3E:
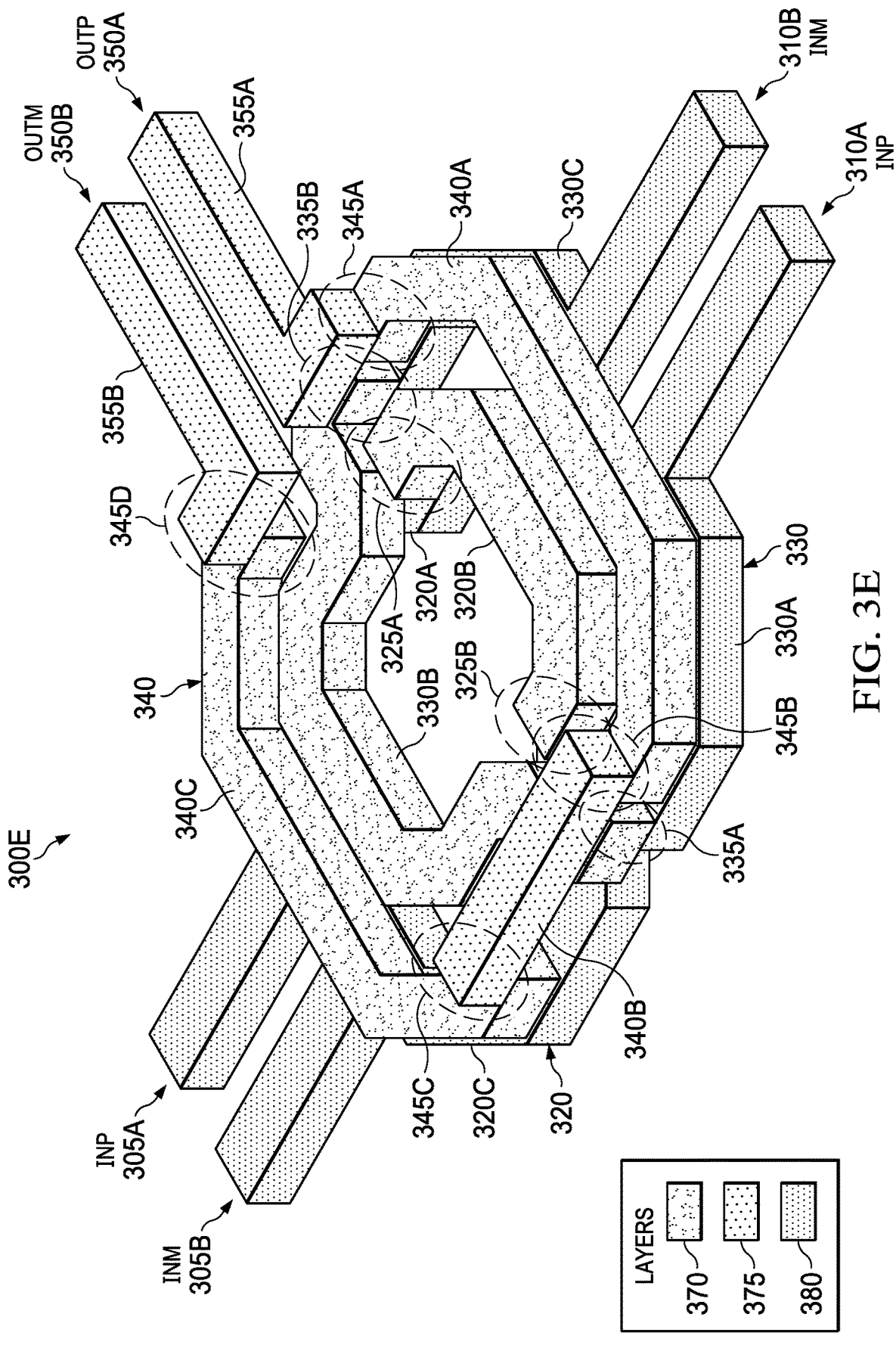

FIG. 3E shows a perspective view 300E of the multi-turn DAT power combiner 300. The first portion 320A and the third portion 320C of the first primary coil 320 and the first portion 330A and the third portion 330C of the second primary coil 330 are placed in a layer 380 beneath the layer 370, which includes the second portion 320B of the first primary coil 320 nested inside the first portion 340A of the secondary coil 340 and the second portion 330B of the second primary coil 330 nested inside the third portion 340C of the secondary coil. The layer 375 above the layer 370 includes second portion 340B of the secondary coil 340 and the leads 355A-B.

Figure 4A:
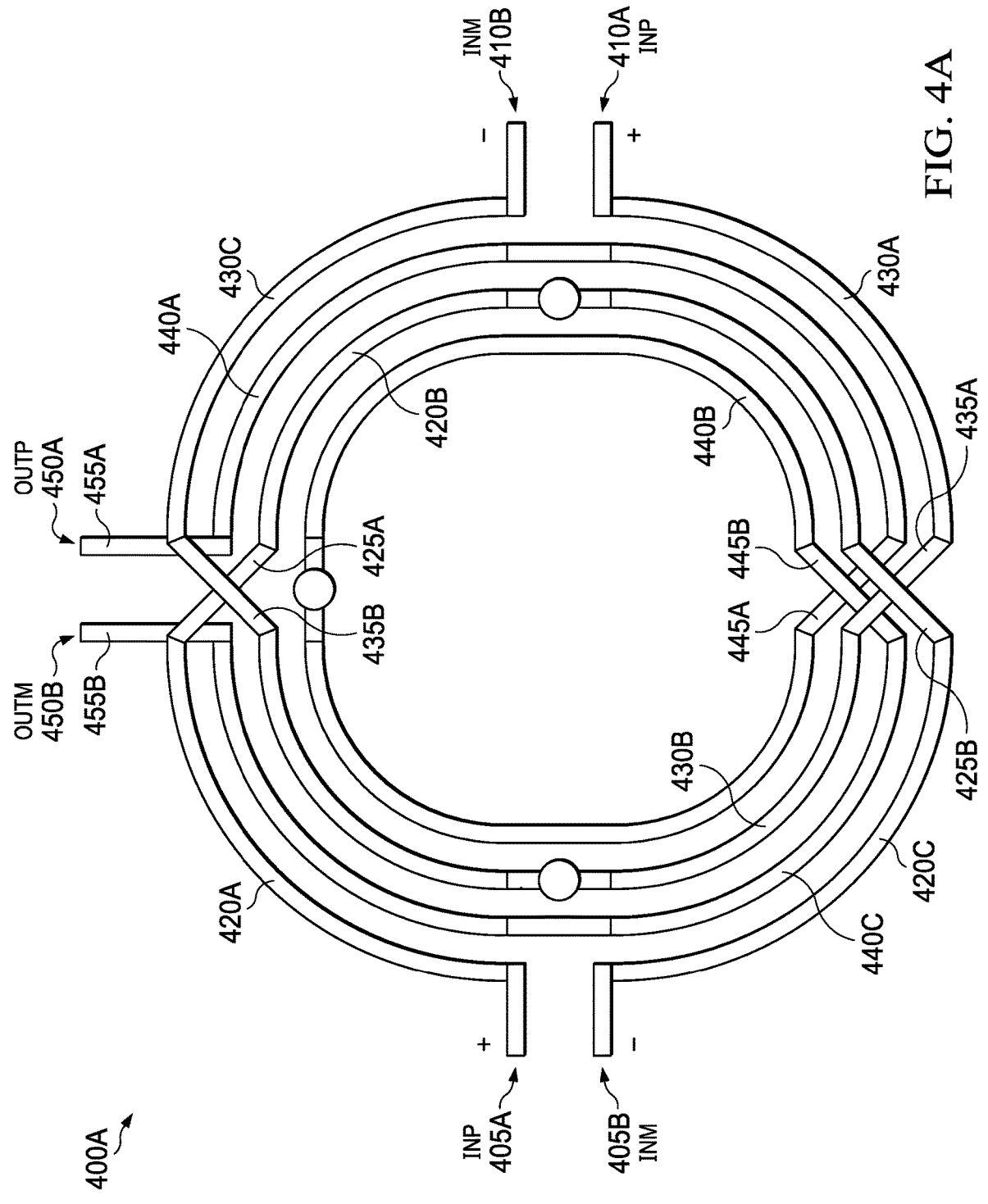
FIGS. 4A-C illustrate different perspectives of another multi-turn distributed active transformer power combiner with a two-to-two turn ratio.
Figure 4B:
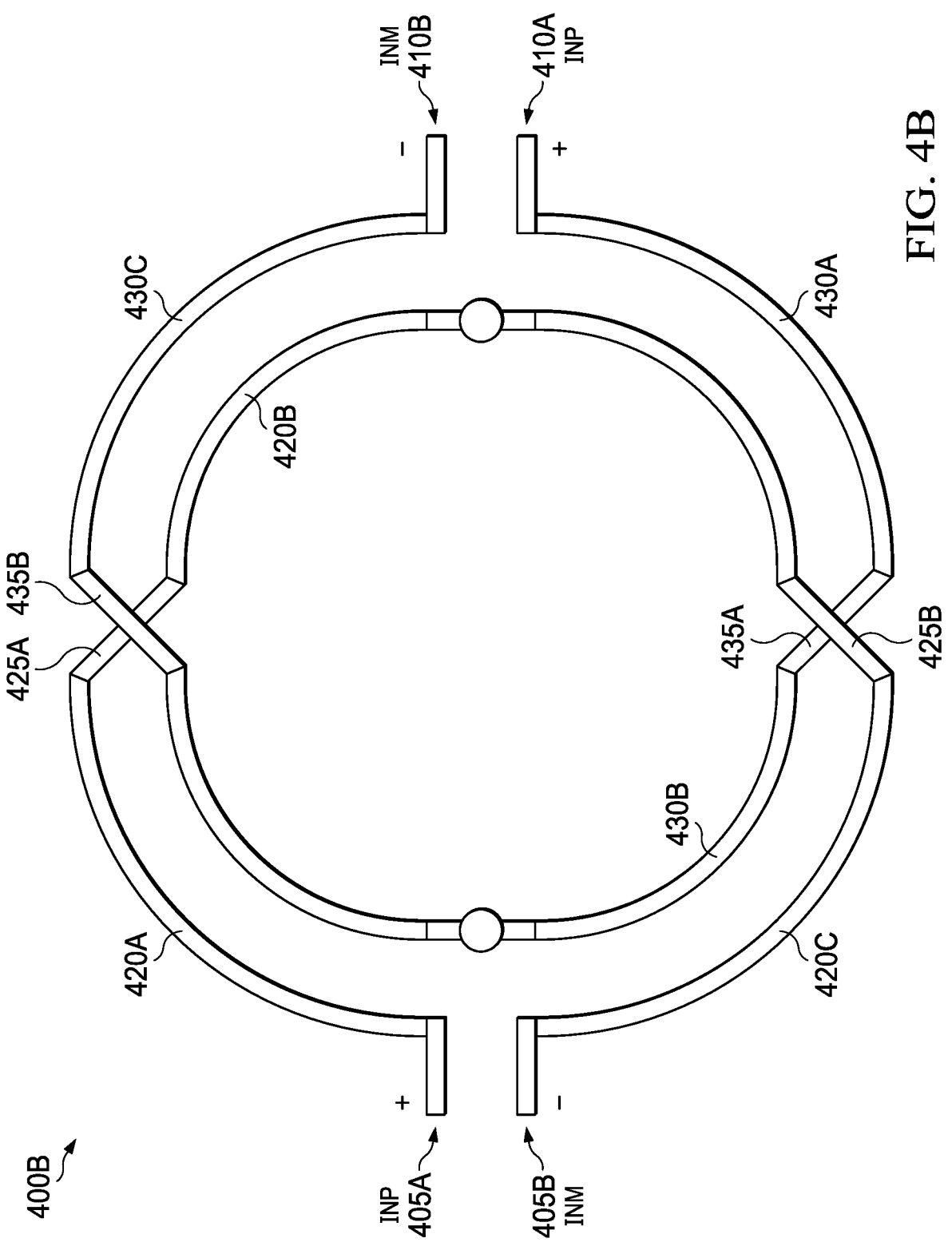
Figure 4C:
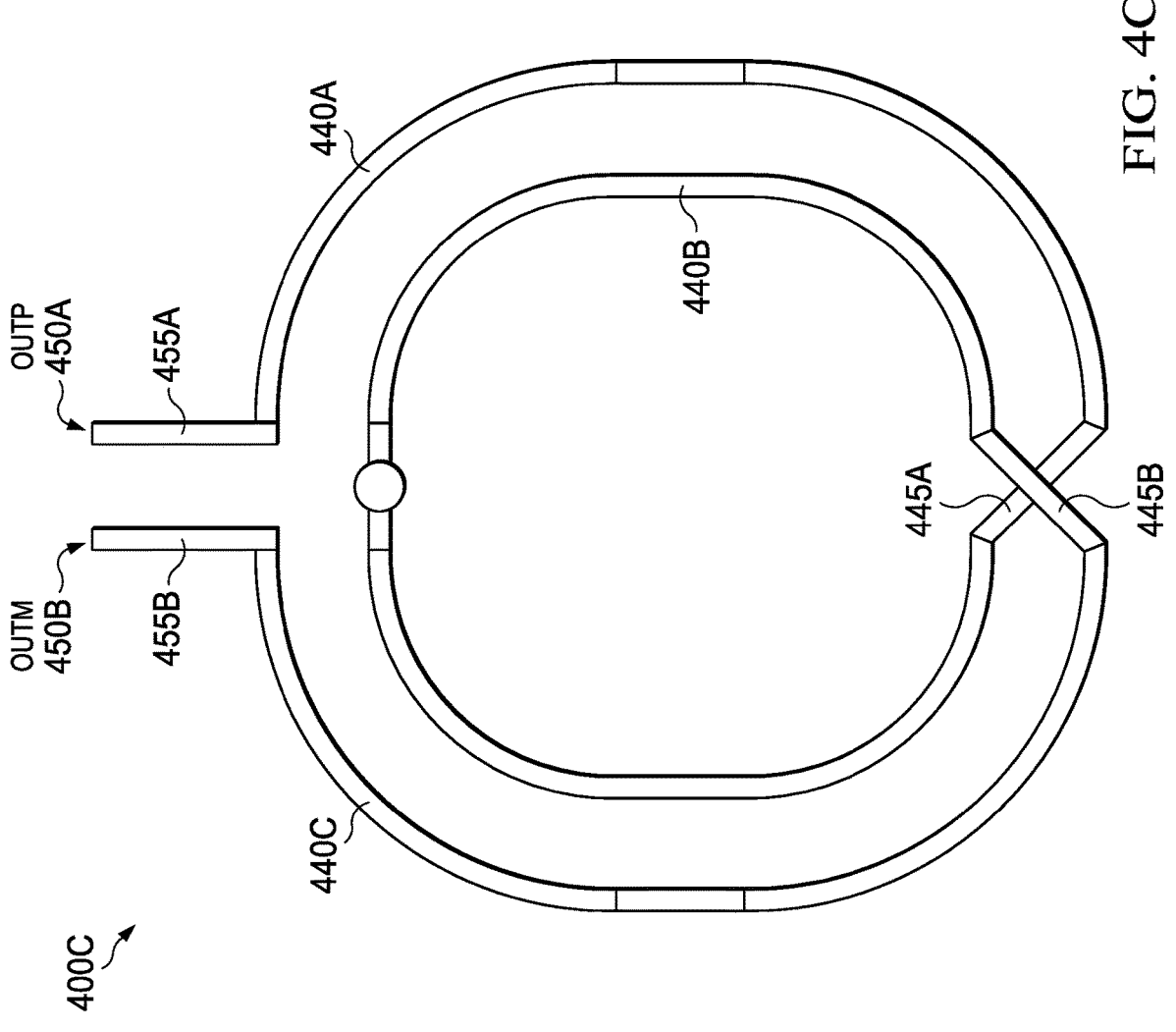

FIGS. 4A-C illustrate different perspectives of another multi-turn distributed active transformer power combiner 400 with a two-to-two turn ratio. FIG. 4A shows an overhead view 400A of the power combiner 400, which includes a first primary coil 420, a second primary coil 430, and a secondary coil 440 in a single layer. The primary coils 420 and 430 are interleaved with the secondary coil 440 such that the primary coils 420 and 430 and the secondary coil 440 are sidewall coupled together. The primary coils 420 and 430 are described further herein with respect to FIG. 4B and each include three portions having a same width. The secondary coil 440 is described further herein with respect to FIG. 4C and includes three portions having a same width.

FIG. 4B shows an overhead view 400B of the primary coils 420 and 430. The first primary coil 420 includes a first portion 420A, a second portion 420B, and a third portion 420C. The second primary coil 430 includes a first portion 430A, a second portion 430B, and a third portion 430C. The first portion 420A of the first primary coil 420 receives a positive input INP 405A of a first differential input signal IN 405 and forms a quarter circle in a first layer of the DAT power combiner 400. The first portion 420A and the second portion 420B of the first primary coil 420 are coupled together by a first joiner 425A that may be in the same or a different layer of the DAT power combiner 400. The different layer may be above or below the layer of the DAT power combiner 400 that includes the first and second portions 420A and 420B, respectively.

The second portion 420B forms a half circle along the inside of the secondary coil 440 in the same first layer as the first portion 420A. The second portion 420B and the third portion 420C of the first primary coil 420 in the first layer are coupled together by a second joiner 425B in the same or the different layer of the DAT power combiner 400. The second joiner 425B is in a same layer as the first joiner 425A. The third portion 420C of the first primary coil 420 forms a quarter circle and receives a negative input INM 405B of IN 405.

The first portion 430A of the second primary coil 430 receives a positive input INP 410A of a second differential input signal IN 410 and forms a quarter circle in the first layer of DAT power combiner 400. The first portion 430A and the second portion 430B of the second primary coil 430 are coupled together by a first joiner 435A in the same layer or a different, second layer of the DAT power combiner 400 as the first and second portions 430A and 430B, respectively. In implementations in which the joiners 425A-B are in the same, first layer as the first, second, and third portions 420A-C of the first primary coil 420 and the first and second portions 430A-B of the second primary coil 430, the joiner 435A is in the second layer. In implementations in which the joiners 425A-B are in the different, second layer of the DAT power combiner 400 as the first, second, and third portions 420A-C of the first primary coil 420 and the first and second portions 430A-B of the second primary coil 430, the joiner 435A can be in the same, first layer as the first, second, and third portions 420A-C of the first primary coil 420 and the first and second portions 430A-B of the second primary coil 430 or a different, third layer from both the first layer and the different, second layer.

The second portion 430B of the second primary coil 430 forms a half circle along the inside of the secondary coil 440. The second portion 430B and the third portion 430C of the second primary coil 430 are coupled together by a second joiner 435B in the same layer as the first joiner 435A. The third portion 430C of the second primary coil 430 forms a quarter circle and receives a negative input INM 410B of IN 410.

FIG. 4C shows an overhead view 400C of the secondary coil 440. A first lead 455A in a different layer from the first layer is coupled to the first portion 440A of the secondary coil 440 by a via and provides the positive output signal OUTP 450A of the differential output signal OUT 450. A second lead 455B in the different layer is coupled to the third portion 440C of the secondary coil 440 by a via and provides the negative output signal OUTM 450B of OUT 450. The first portion 440A of the secondary coil 440 forms a half circle in the first layer of the DAT power combiner 400.

The second portion 440B of the secondary coil 440 forms a circle inside the half circle of the first portion 440A in the first layer. The first and second portions 440A and 440B of the secondary coil 440 are coupled together by a first joiner 445A, which may be in the same or the different second or third layers. The third portion 440C of the secondary coil 440 forms a half circle on the outside of the inner portion 440B and is coupled to the second lead 455B.

Figure 5A:
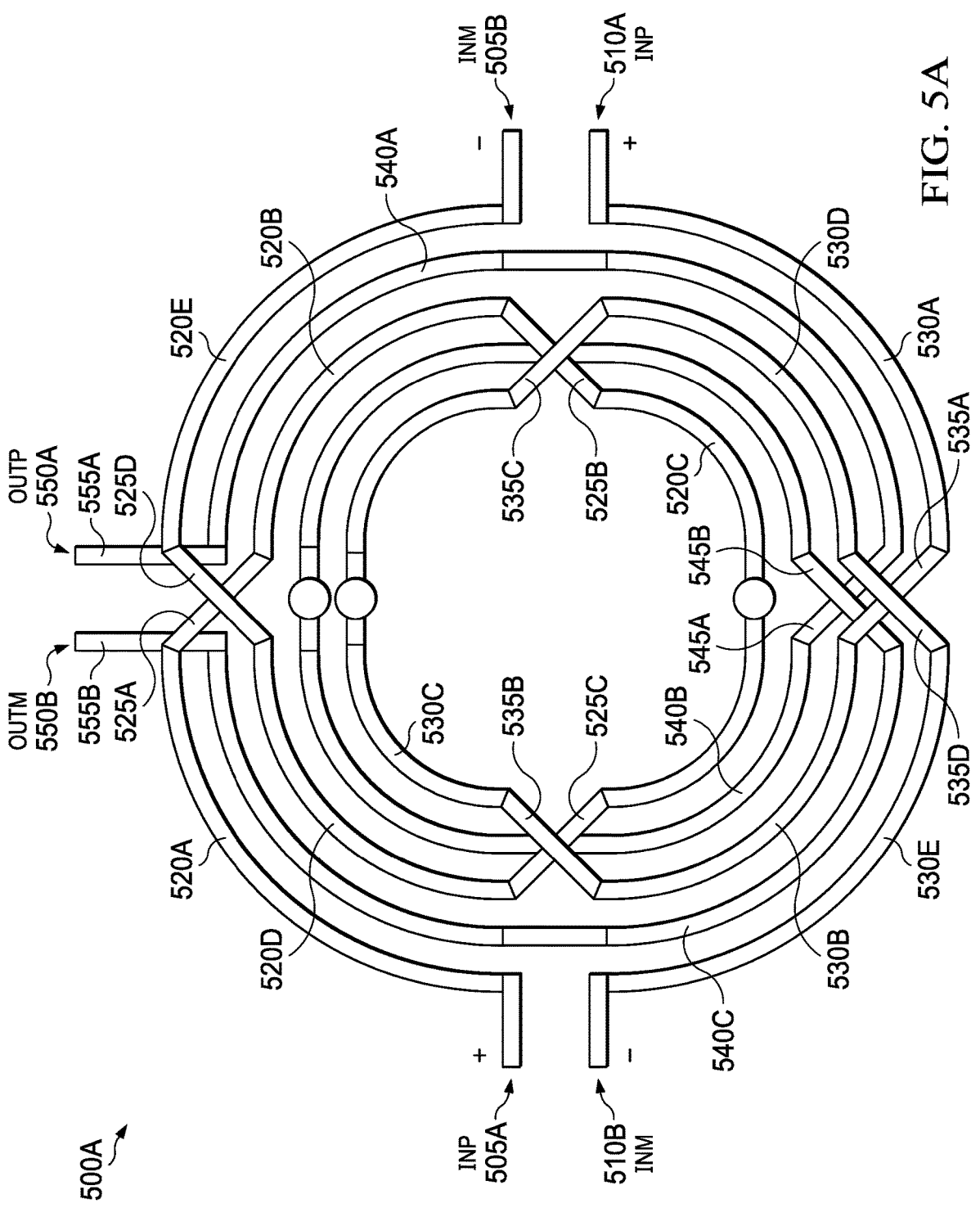
FIGS. 5A-C illustrate different perspectives of a multi-turn distributed active transformer power combiner with a three-to-two turn ratio.
Figure 5B:
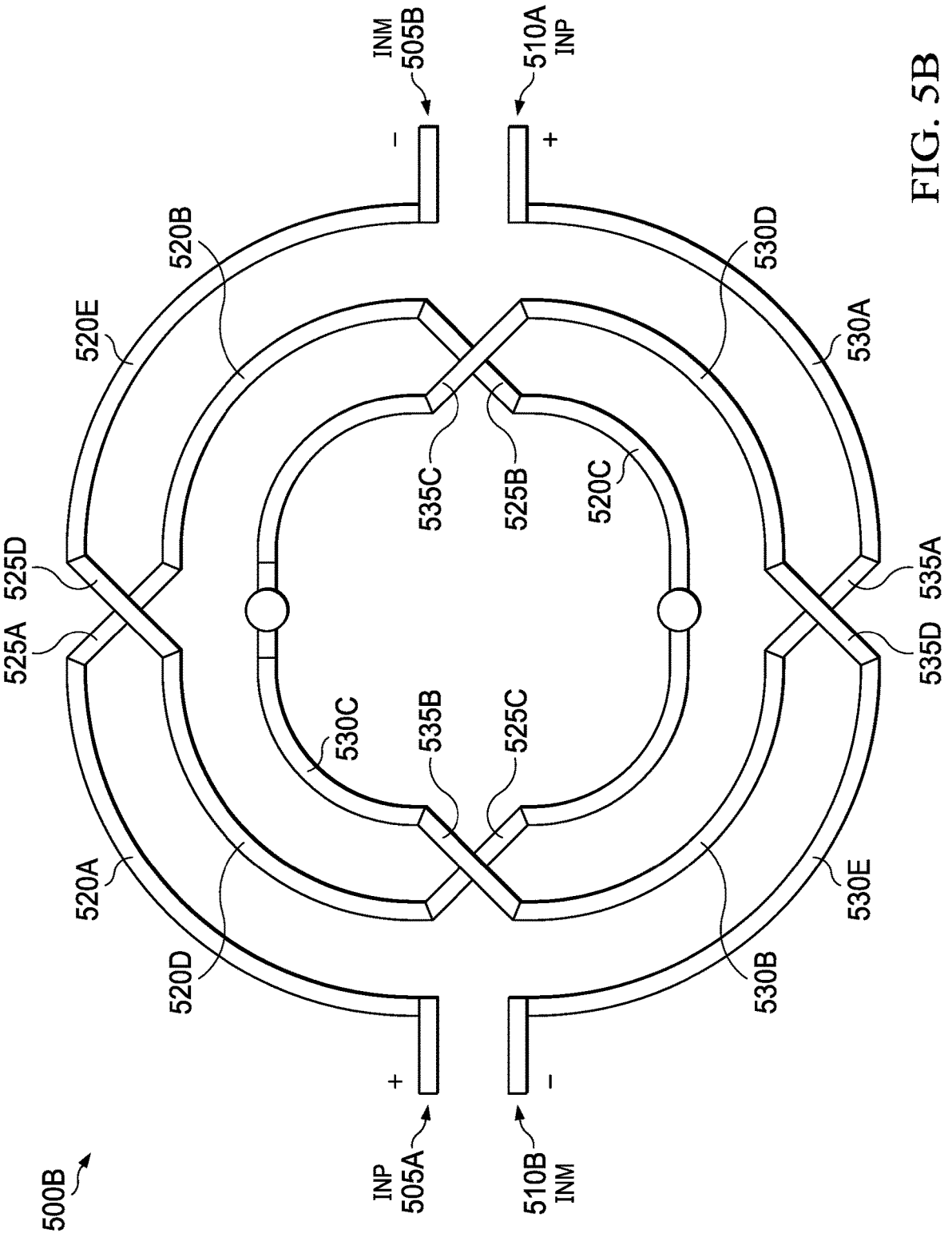
Figure 5C:
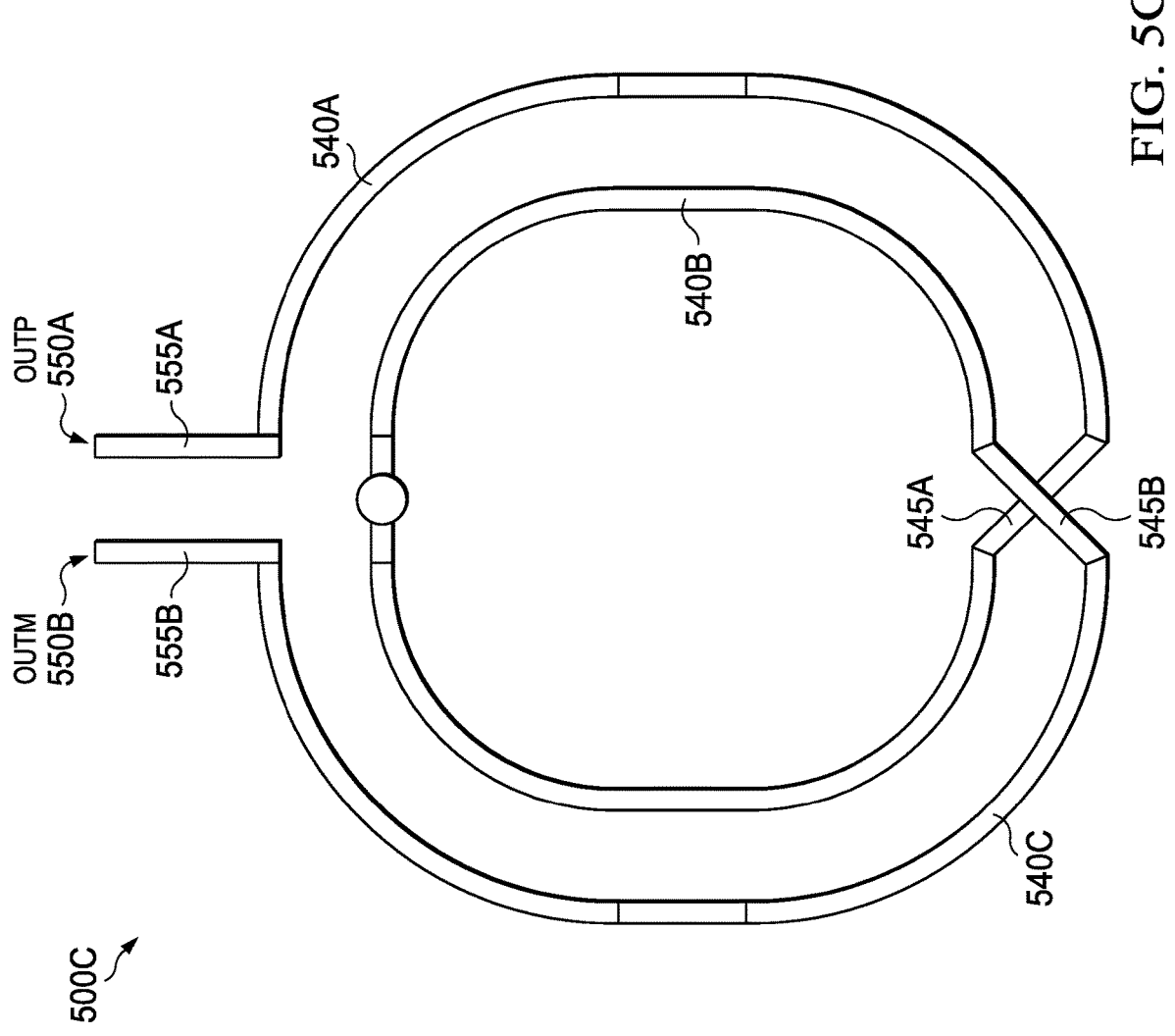

FIGS. 5A-C illustrate different perspectives of a multi-turn distributed active transformer power combiner 500 with a three-to-two turn ratio. FIG. 5A shows an overhead view 500A of the power combiner 500, which includes a first primary coil 520, a second primary coil 530, and a secondary coil 540 in a single layer. The primary coils 520 and 530 are interleaved with the secondary coil 540 such that the primary coils 520 and 530 and the secondary coil 540 are sidewall coupled together. The primary coils 520 and 530 are described further herein with respect to FIG. 5B and each include five portions having a same width. The secondary coil 540 is described further herein with respect to FIG. 5C and includes three portions having a same width.

FIG. 5B shows an overhead view 500B of the primary coils 520 and 530. The first primary coil 520 includes a first portion 520A, a second portion 520B, a third portion 520C, a fourth portion 520D, and a fifth portion 520E in the first layer. The second primary coil 530 includes a first portion 530A, a second portion 530B, a third portion 530C, a fourth portion 530D, and a fifth portion 530E in the first layer. The first portion 520A of the first primary coil 520 receives a positive input INP 505A of a first differential input signal IN 505 and forms a quarter circle in a first layer of the DAT power combiner 500. The first portion 520A and the second portion 520B of the first primary coil 520 are coupled together by a first joiner 525A that may be in the same or a different layer of the DAT power combiner 500. The different layer may be above or below the layer of the DAT power combiner 500 that includes the first and second portions 520A and 520B, respectively.

The second portion 520B forms a quarter circle in the same first layer as the first portion 520A. The second portion 520B and the third portion 520C of the first primary coil 520 in the first layer are coupled together by a second joiner 525B in the same or the different layer of the DAT power combiner 500. The second joiner 525B is in a same layer as the first joiner 525A. The third portion 520C of the first primary coil 520 forms a half circle and is coupled to the fourth portion 520D by a third joiner 525C in the same layer as the first and second joiners 525A and 525B. The fourth portion 520D forms a quarter circle on the inside of the first portion 520A and is coupled to the fifth portion 520E by a fourth joiner 525D in the same layer as the first, second, and third joiners 525A-C. The fifth portion 520E forms a quarter circle on the outside of the second portion 520B and receives a negative input INM 505B of the first differential input signal IN 505.

The first portion 530A of the second primary coil 530 receives a positive input INP 510A of a second differential input signal IN 510 and forms a quarter circle in the first layer of DAT power combiner 500. The first portion 530A and the second portion 530B of the second primary coil 530 are coupled together by a first joiner 535A in the same layer or a different, third layer of the DAT power combiner 500 as the first and second portions 530A and 530B, respectively. In implementations in which the joiners 525 are in the same, first layer as the first primary coil 520 and the first and second portions 530A-B of the second primary coil 530, the joiner 535A is in the different layer. In implementations in which the joiners 525 are in the different, second layer as the first primary coil 520 and the first and second portions 530A-B of the second primary coil 530, the joiner 535A can be in the same, first layer as the first primary coil 520 and the first and second portions 530A-B of the second primary coil 530 or a different, third layer from both the first layer and the different, second layer.

The second portion 530B of the second primary coil 530 forms a quarter circle along the inside of the secondary coil 540. The second portion 530B and the third portion 530C of the second primary coil 530 are coupled together by a second joiner 535B in the same layer as the first joiner 535A. The third portion 530C of the second primary coil 530 forms a half circle and is coupled to the fourth portion 530D by a third joiner 535C in the same layer as the first and second joiners 535A and 535B. The fourth portion 530D forms a quarter circle on the inside of the first portion 530A and is coupled to the fifth portion 530E by a fourth joiner 535D in the same layer as the first, second, and third joiners 535A-C. The fifth portion 530E forms a quarter circle on the outside of the second portion 530B, and receives a negative input INM 510B of the first differential input signal IN 510.

FIG. 5C shows an overhead view 500C of the secondary coil 540. A first lead 555A in a different layer from the first layer is coupled to the first portion 540A of the secondary coil 540 by a via and provides the positive output signal OUTP 550A of the differential output signal OUT 550. A second lead 555B in the different layer is coupled to the third portion 540C of the secondary coil 540 by a via and provides the negative output signal OUTM 550B of OUT 550. The first portion 540A of the secondary coil 540 forms a half circle in the first layer of the DAT power combiner 500.

The second portion 540B of the secondary coil 540 forms a circle inside the half circle of the first portion 540A in the first layer. The first and second portions 540A and 540B of the secondary coil 540 are coupled together by a first joiner 545A, which may be in the same or the different second or third layers. The third portion 540C of the secondary coil 540 forms a half circle on the outside of the inner portion 540B and is coupled to the second lead 555B.

Figure 6A:
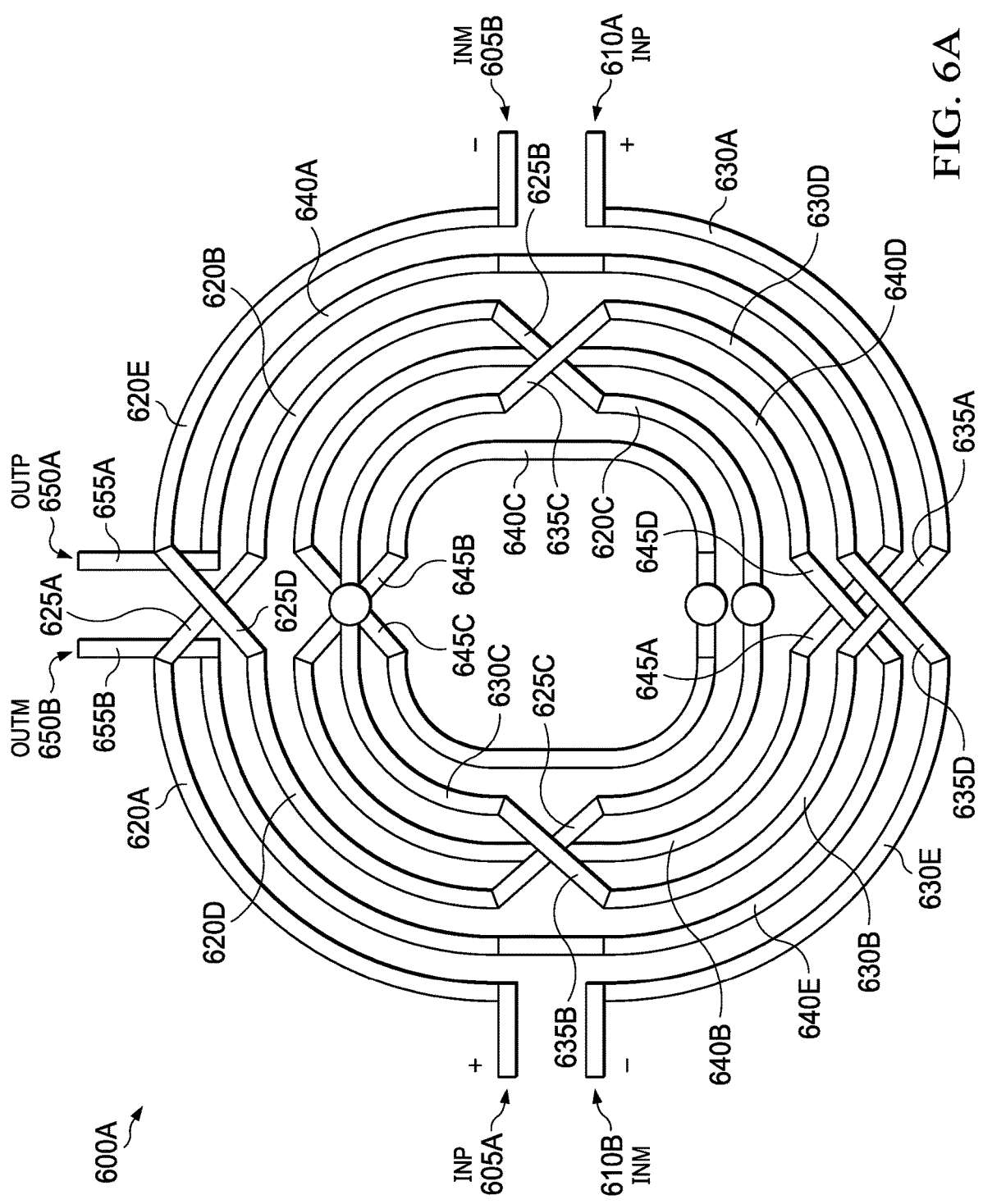
FIGS. 6A-C illustrate different perspectives of a multi-turn distributed active transformer power combiner with a three-to-three turn ratio.
Figure 6B:
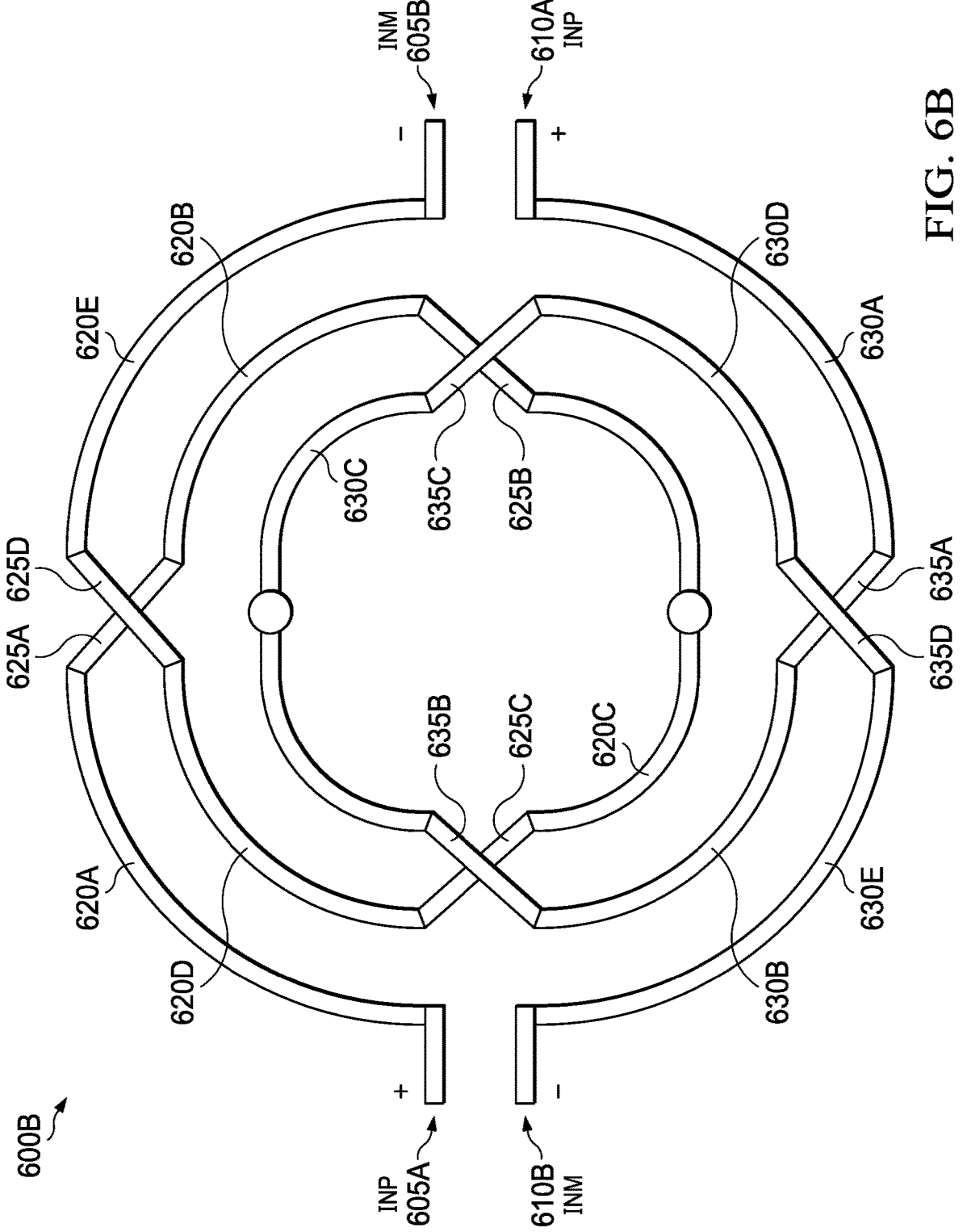
Figure 6C:
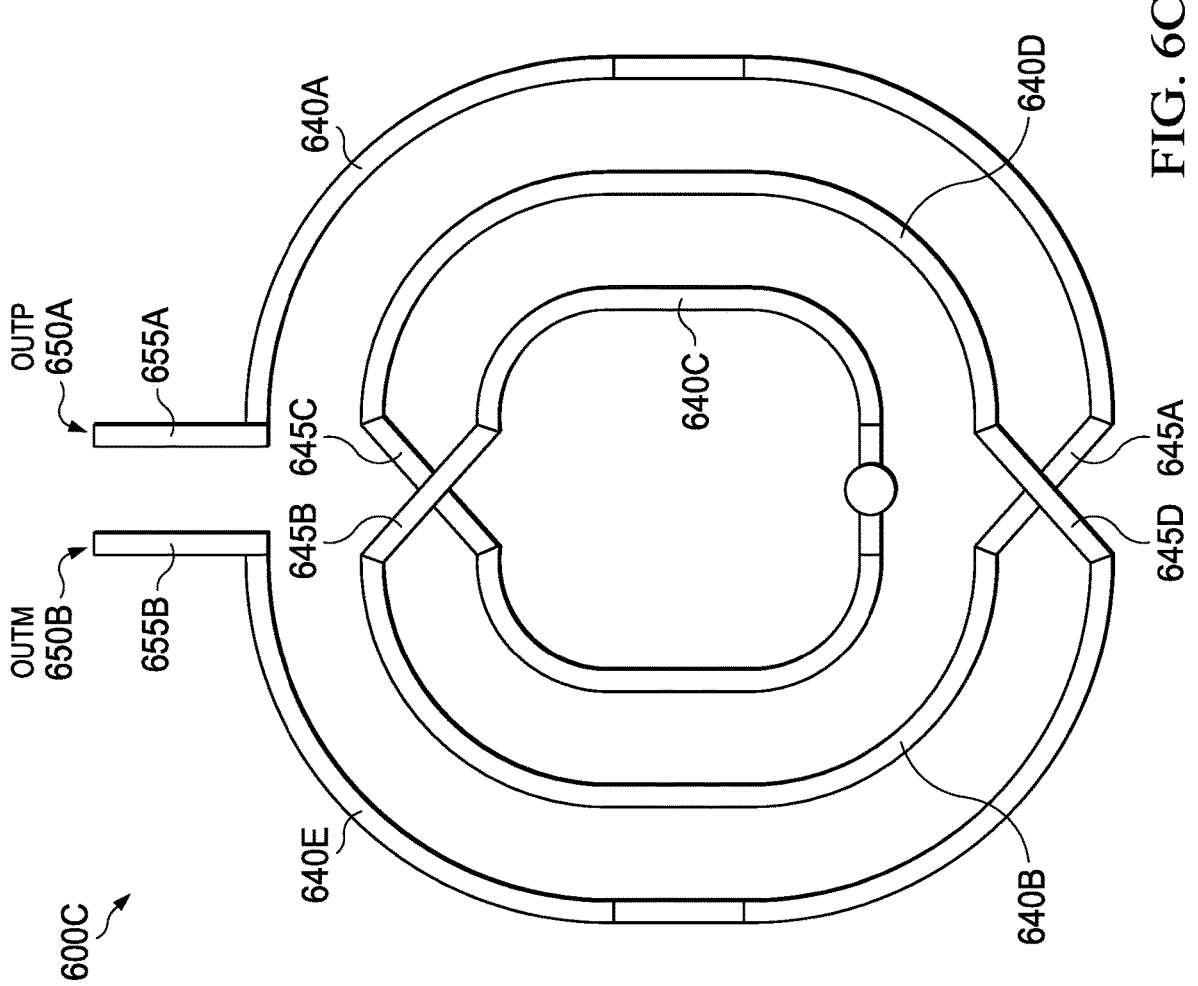

FIGS. 6A-C illustrate different perspectives of a multi-turn distributed active transformer power combiner 600 with a three-to-three turn ratio. FIG. 6A shows an overhead view 600A of the power combiner 600, which includes a first primary coil 620, a second primary coil 630, and a secondary coil 640 in a single layer. The primary coils 620 and 630 are interleaved with the secondary coil 640 such that the primary coils 620 and 630 and the secondary coil 640 are sidewall coupled together. The primary coils 620 and 630 are described further herein with respect to FIG. 6B and each include five portions having a same width. The secondary coil 640 is described further herein with respect to FIG. 6C and includes five portions having a same width.

FIG. 6B shows an overhead view 600B of the primary coils 620 and 630. The first primary coil 620 includes a first portion 620A, a second portion 620B, a third portion 620C, a fourth portion 620D, and a fifth portion 620E in the first layer. The second primary coil 630 includes a first portion 630A, a second portion 630B, a third portion 630C, a fourth portion 630D, and a fifth portion 630E in the first layer. The first portion 620A of the first primary coil 620 receives a positive input INP 605A of a first differential input signal IN 605 and forms a quarter circle in a first layer of the DAT power combiner 600. The first portion 620A and the second portion 620B of the first primary coil 620 are coupled together by a first joiner 625A that may be in the same or a different layer of the DAT power combiner 600. The different layer may be above or below the layer of the DAT power combiner 600 that includes the first and second portions 620A and 620B, respectively.

The second portion 620B forms a quarter circle in the same first layer as the first portion 620A. The second portion 620B and the third portion 620C of the first primary coil 620 in the first layer are coupled together by a second joiner 625B in the same or the different layer of the DAT power combiner 600. The second joiner 625B is in a same layer as the first joiner 625A. The third portion 620C of the first primary coil 620 forms a half circle and is coupled to the fourth portion 620D by a third joiner 625C in the same layer as the first and second joiners 625A and 625B. The fourth portion 620D forms a quarter circle on the inside of the first portion 620A and is coupled to the fifth portion 620E by a fourth joiner 625D in the same layer as the first, second, and third joiners 625A-C. The fifth portion 620E forms a quarter circle on the outside of the second portion 620B, and receives a negative input INM 605B of the first differential input signal IN 605.

The first portion 630A of the second primary coil 630 receives a positive input INP 610A of a second differential input signal IN 610 and forms a quarter circle in the first layer of DAT power combiner 600. The first portion 630A and the second portion 630B of the second primary coil 630 are coupled together by a first joiner 635A in the same layer or a different, third layer of the DAT power combiner 600 as the first and second portions 630A and 630B, respectively. In implementations in which the joiners 625 are in the same, first layer as the first primary coil 620 and the first and second portions 630A-B of the second primary coil 630, the joiner 635A is in the different layer. In implementations in which the joiners 625 are in the different, second layer as the first primary coil 620 and the first and second portions 630A-B of the second primary coil 630, the joiner 635A can be in the same, first layer as the first primary coil 620 and the first and second portions 630A-B of the second primary coil 630 or a different, third layer from both the first layer and the different, second layer.

The second portion 630B of the second primary coil 630 forms a quarter circle along the inside of the secondary coil 640. The second portion 630B and the third portion 630C of the second primary coil 630 are coupled together by a second joiner 635B in the same layer as the first joiner 635A. The third portion 630C of the second primary coil 630 forms a half circle and is coupled to the fourth portion 630D by a third joiner 635C in the same layer as the first and second joiners 635A and 635B. The fourth portion 630D forms a quarter circle on the inside of the first portion 630A and is coupled to the fifth portion 630E by a fourth joiner 635D in the same layer as the first, second, and third joiners 635A-C. The fifth portion 630E forms a quarter circle on the outside of the second portion 630B, and receives a negative input INM 610B of the first differential input signal IN 610.

FIG. 6C shows an overhead view 600C of the secondary coil 640. A first lead 655A in a different layer from the first layer is coupled to the first portion 640A of the secondary coil 640 by a via and provides the positive output signal OUTP 650A of the differential output signal OUT 650. A second lead 655B in the different layer is coupled to the fifth portion 640E of the secondary coil 640 by a via and provides the negative output signal OUTM 650B of OUT 650. The first portion 640A of the secondary coil 640 forms a half circle in the first layer of the DAT power combiner 600.

The second portion 640B of the secondary coil 640 forms a smaller half circle opposite the half circle of the first portion 640A in the first layer. The first and second portions 640A and 640B of the secondary coil 640 are coupled together by a first joiner 645A, which may be in the same first layer or the different second or third layers. In implementations in which the joiners 625 or 635 are in the first layer, the joiner 645A is in the different second or third layers. In implementations in which the joiners 625 and 635 are in the different second or third layers, the joiner 645A is in the same first layer.

The third portion 640C of the secondary coil 640 forms a circle inside the half circles of portions 640A and 640B, and is coupled to the portion 640B by a second joiner 645B in the same layer as the first joiner 645A. The fourth portion 640D of the secondary coil 640 forms a half circle between the third portion 640C and the first portion 640A and is coupled to the third portion 640C by a third joiner 645C in the same layer as joiners 645A-B. The fifth portion 640E of the secondary coil 640 forms a half circle outside the second portion 640B and is coupled to the fourth portion 640D by a fourth joiner 645D in the same layer as joiners 645A-C. The fifth portion 640E is further coupled to the second lead 655B.

The two-to-one, two-to-two, three-to-two, and three-to-three turn ratios are shown herein to illustrate the extension of the principled described herein to a variety of turn ratios and layer configurations. Other turn ratios and layer configurations are possible within the scope of this description.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An apparatus, comprising:
a power combiner having a first side and a second side opposing the first side, the power combiner including:
a first coil having first ends on the first side, the first coil including first and second portions on the first side and a third portion coupled between the first and second portions and on the second side, the first ends coupled to first inputs of the power combiner;
a second coil having second ends on the second side, the second coil including first and second portions on the second side and a third portion coupled between the first and second portions of the second coil and on the first side, the first and second portions of the first coil on a periphery of the third portion of the second coil, and the first and second portions of the second coil on a periphery of the third portion of the first coil, and the second ends coupled to second inputs of the power combiner; and
a third coil having a first portion that extends along the first and second portions of the first coil and a second portion that extends along the first and second portions of the second coil, the third coil having third ends coupled to outputs of the power combiner.

2. The apparatus of claim 1, wherein:
the first and second portions of the first coil and the first and second portions of the second coil are in a layer.

3. The apparatus of claim 2, wherein the layer is a first layer, the second portion of the first and second coils are in the first layer, and the first coil includes a first joiner portion coupled between the first portion and the second portion and a second joiner portion coupled between the second portion and the third portion, the first and second joiner portions being in a second layer.

4. The apparatus of claim 3, further comprising a bridge portion coupled between the first portion and the second portion of the third coil, the bridge portion being in a third layer.

5. The apparatus of claim 4, wherein the first layer is between the second and third layers.

6. The apparatus of claim 1, further comprising:
a first lead coupled to the first portion of the third coil; and
a second lead coupled to the second portion of the third coil, wherein the first and second leads are coupled to differential outputs.

7. The apparatus of claim 6, wherein the first and second leads are in a different layer from the third coil.

8. The apparatus of claim 1, wherein the first inputs are first differential inputs, and the second inputs are second differential inputs.

9. The apparatus of claim 1, wherein the first portion of the first coil and the first portion of the second coil is symmetrical with the second portion of the first coil and the second portion of the second coil, and the third portion of the first coil is symmetrical with the third portion the second coil.

10. An apparatus, comprising:
a distributed active transformer (DAT) having a first side and a second side opposing the first side, the DAT including:
a first coil having first ends on the first side, the first coil including first and second portions on the first side and a third portion coupled between the first and second portions and on the second side, the first ends coupled to first inputs of the DAT;
a second coil having second ends on the second side, the second coil including first and second portions on the second side and a third portion coupled between the first and second portions of the second coil and on the first side, the first and second portions of the first coil on a periphery of the third portion of the second coil, and the first and second portions of the second coil on a periphery of the third portion of the first coil, and the second ends coupled to second inputs of the DAT; and
a third coil having a first portion that extends along the first and second portions of the first coil and a second portion that extends along the first and second portions of the second coil, the third coil having third ends coupled to outputs of the DAT.

11. The apparatus of claim 10, wherein:
the first and third portions of the first and second coils are in a layer.

12. The apparatus of claim 11, wherein:
the layer is a first layer;
the second portion of the first and second coils are in a second layer;
the first portion of the first coil is coupled to the second portion of the first coil by a first via;
the second portion of the first coil is coupled to the third portion of the first coil by a second via;
the first portion of the second coil is coupled to the second portion of the second coil by a third via; and
the second portion of the second coil is coupled to the third portion of the second coil by a fourth via.

13. The apparatus of claim 12, further comprising a bridge portion coupled between the first and second portions of the third coil, the bridge portion being in a third layer, wherein the second layer is between the first and third layers.

14. The apparatus of claim 10, further comprising:
a first lead coupled to the first portion of the third coil by a first via; and
a second lead coupled to the second portion of the third coil by a second via, wherein the first and second leads are coupled to differential outputs.

15. The apparatus of claim 10, further comprising:
a first supply voltage line coupled to the second portion of the first coil; and
a second supply voltage line coupled to the second portion of the second coil.

16. A system, comprising:
a circuit having a first side and a second side opposing the first side, the circuit including:
a first coil having first ends on the first side, the first coil including first and second portions on the first side and a third portion coupled between the first and second portions and on the second side, the first ends coupled to first inputs of the circuit;
a second coil having second ends on the second side, the second coil including first and second portions on the second side and a third portion coupled between the first and second portions of the second coil and on the first side, the first and second portions of the first coil on a periphery of the third portion of the second coil, and the first and second portions of the second coil on a periphery of the third portion of the first coil, and the second ends coupled to second inputs of the circuit; and a third coil having a first portion that extends along the first and second portions of the first coil and a second portion that extends along the first and second portions of the second coil, the third coil having third ends coupled to outputs of the circuit.

17. The system of claim 16, wherein the first and third portions of the first coil and the first and third portions of the second coil are in a layer.

18. The system of claim 17, further comprising a bridge portion coupled between the first and second portions of the third coil.

19. The system of claim 18, wherein the circuit is part of a power combiner.

\* \* \* \* \*